United States Patent [19]

Abe et al.

[11] Patent Number: 4,964,049

[45] Date of Patent: Oct. 16, 1990

[54] DIAGNOSIS SYSTEM FOR A MOTOR VEHICLE

[75] Inventors: Kunihiro Abe; Tomoya Kobayashi, both of Tokyo, Japan

[73] Assignee: Fuji Jukogyo Kabushiki Kaisha, Tokyo, Japan

[21] Appl. No.: 278,797

[22] Filed: Nov. 30, 1988

[30] Foreign Application Priority Data

Dec. 11, 1987 [JP] Japan .................................. 62-313436

[51] Int. Cl.⁵ ...................... G01M 15/00; F02D 41/26; F02P 17/00
[52] U.S. Cl. .............................. 364/431.01; 73/117.2; 364/551.01
[58] Field of Search ...................... 364/431.01, 431.11, 364/551.01, 424.03, 424.04; 73/116, 117.3, 119 R, 117.2; 371/29

[56] References Cited

U.S. PATENT DOCUMENTS

| 4,108,362 | 8/1978 | Trussel et al. | 73/116 |
| 4,567,756 | 2/1986 | Colborn | 73/118.1 |
| 4,694,408 | 9/1987 | Zaleski | 364/431.01 |
| 4,748,843 | 6/1988 | Schäfer et al. | 73/118.1 |
| 4,757,463 | 7/1988 | Ballou et al. | 364/431.01 |

FOREIGN PATENT DOCUMENTS 58-12848 1/1983 Japan .............................. 364/431.01

Primary Examiner—Felix D. Gruber
Attorney, Agent, or Firm—Martin A. Farber

[57] ABSTRACT

An electronic control system for controlling an automotive engine is mounted on a motor vehicle. A memory in a computer stores a plurality of data formats. One of the data formats is selected, and a data demand signal dependent on a selected data format is fed to the electronic control system. In response to data sent from the electronic control system, a diagnosis is performed.

5 Claims, 7 Drawing Sheets

FIG. 4a

| HIGH-ORDER ADDRESS | LOW-ORDER ADDRESS | OUTPUT DATA | SUM CHECK |
|---|---|---|---|
| $a_1$ | $a_2$ | $a_3$ | $a_4$ |

| HIGH-ORDER ADDRESS | LOW-ORDER ADDRESS | BYTE COUNT | OUTPUT DATA | ... | OUTPUT DATA | SUM CHECK |
|---|---|---|---|---|---|---|
| $b_1$ | $b_2$ | $b_3$ | $b_4$ | | $b_{n-1}$ | $b_n$ |

| HIGH-ORDER ADDRESS | LOW-ORDER ADDRESS | OUTPUT DATA | ... | OUTPUT DATA | BLANK |
|---|---|---|---|---|---|
| $c_1$ | $c_2$ | $c_3$ | | $c_{n-1}$ | $c_n$ |

F3

DIAGNOSIS SYSTEM FOR A MOTOR VEHICLE

BACKGROUND OF THE INVENTION

The present invention relates to a diagnosis system for a motor vehicle and more particularly to a system where data formats are provided and a format for a vehicle to be diagnosed is properly selected.

Recently, a motor vehicle has been equipped with an electronic control system for controlling various components of an engine, such as fuel injectors, thereby improving driveability, exhaust gas emission, fuel consumption, and engine power. The electronic control system controls the components based on information represented by output signals from various sensors for detecting engine operating conditions. Accordingly, if malfunctions of components and sensors occur, the engine does not properly operate.

However, because of the complexity of the electronic control system, it is difficult to immediately find out the trouble. Accordingly, a trouble diagnosis device for easily checking the electronic control system should be equipped in an auto shop.

Japanese Patent Application Laid-Open No. 58-12848 discloses a diagnosis system in which an exclusive checking device is provided for measuring a pulse duration of fuel injection and engine speed, and for checking whether idling speed is normal.

Generally, data are transmitted between the diagnosis device and the control system provided in the vehicle in accordance with only one data format. For example, a data format F1 as shown in FIG. 4a is used for transmitting data such as coolant temperature and battery voltage one by one.

Since data of the coolant temperature and the battery voltage do not change much in a short period, the time for processing data is not delayed even if the data are transmitted by only one data format.

However, data such as the fuel injection pulse width of an engine varies with engine operating conditions such as engine speed and load of the engine. Therefore, it is necessary to measure data for the engine operating conditions as well as the fuel injection pulse width.

Heretofore, data for the fuel injection pulse width or the engine operating conditions are transmitted in accordance with one data format. Accordingly, it takes a long time to transmit data and hence to diagnose the vehicle.

SUMMARY OF THE INVENTION

The object of the present invention is to provide a diagnosis system which may quickly diagnose a motor vehicle.

According to the present invention, there is provided a system for diagnosing an automotive engine which is mounted on a motor vehicle and controlled by an electronic control system, comprising a diagnosis device including a computer having a central processing unit and a memory, the memory having a plurality of programs for diagnosing the motor vehicle, connecting means connecting the diagnosis device to the electronic control system, a plurality of data formats provided in the computer, select means for selecting one of the data formats in accordance with data to be monitored, demand means for sending a data demand signal dependent on a selected data format to the electronic control system, and means responsive to data sent from the electronic control system for performing a diagnosis dependent on the programs.

The other objects and features of this invention will become understood from the following description with reference to the accompanying drawings.

BRIEF DESCRIPTION OF DRAWINGS

FIGS. 4a to 4c show various data formats;

DETAILED DESCRIPTION OF THE PREFERRED EMBODIMENT

Figure 1:
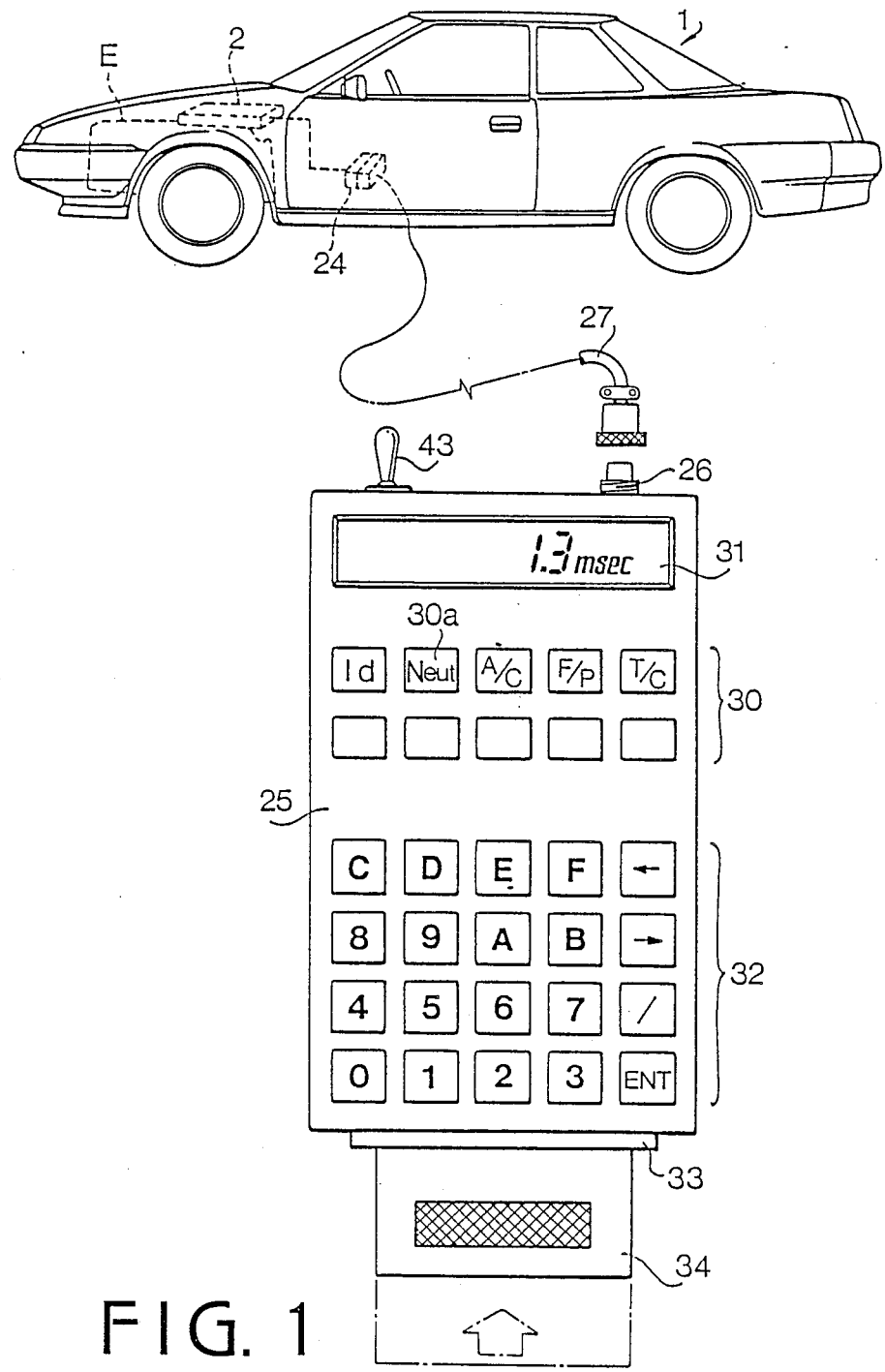
FIG. 1 is a schematic illustration of a diagnosis system according to the present invention.

Referring to FIG. 1, an automobile 1 is equipped with an electronic control system 2 for controlling various components of an engine E. The electronic control system 2 is connected to an external connector 24. A portable diagnosis device 25 comprising a microcomputer has a connector 26, to which the connector 24 of the system 2 is connected through an adapter harness 27.

The diagnosis device 25 has a power switch 43, a liquid crystal display 31, an indicator section 30 consisting of a plurality of indicators of LED, and a keyboard 32. A connector 33 is provided for connecting a detachable memory cartridge 34.

Figure 2A:
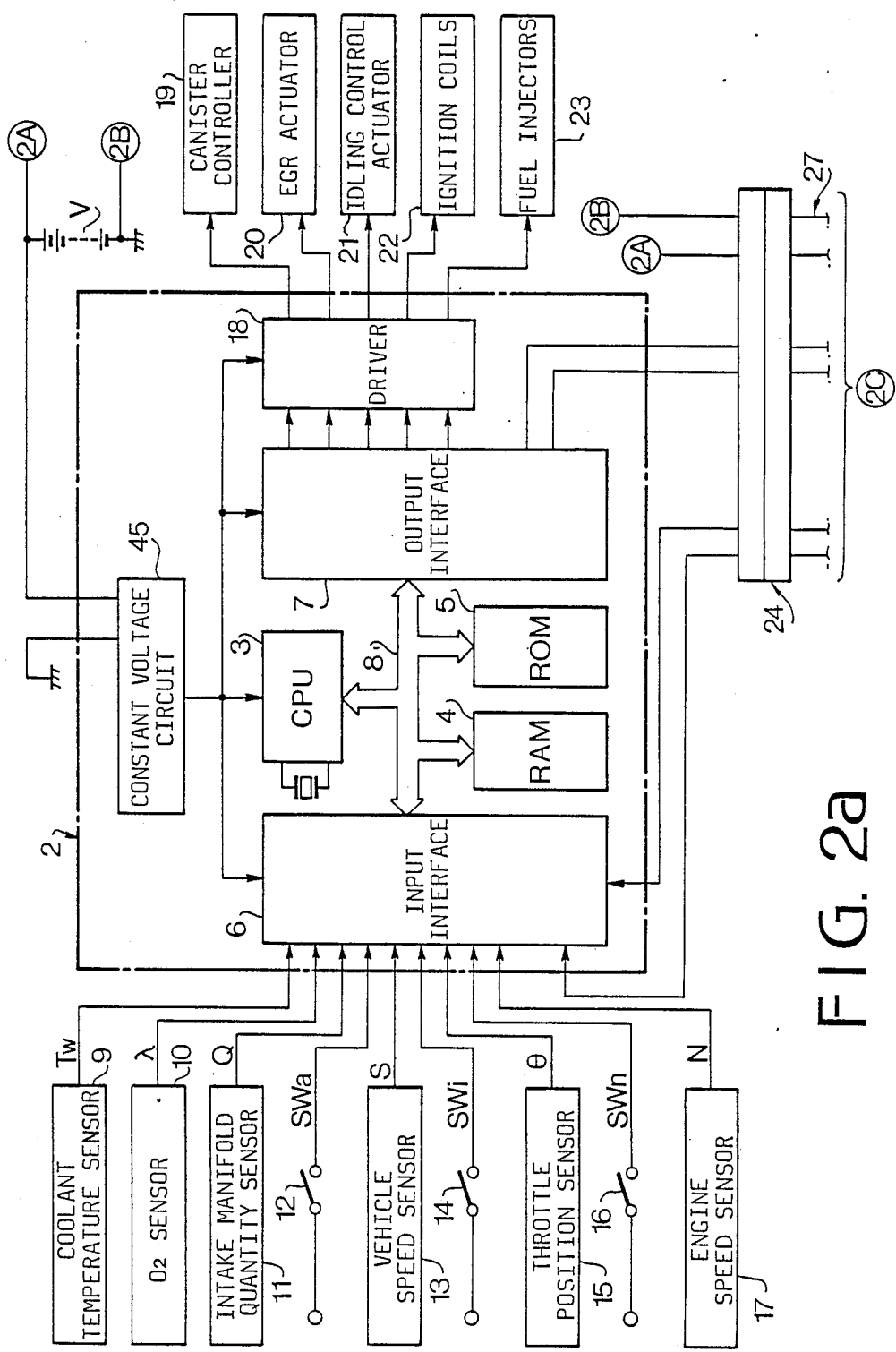
FIGS. 2a and 2b are block diagrams showing the construction of the diagnosis system.
Figure 2B:
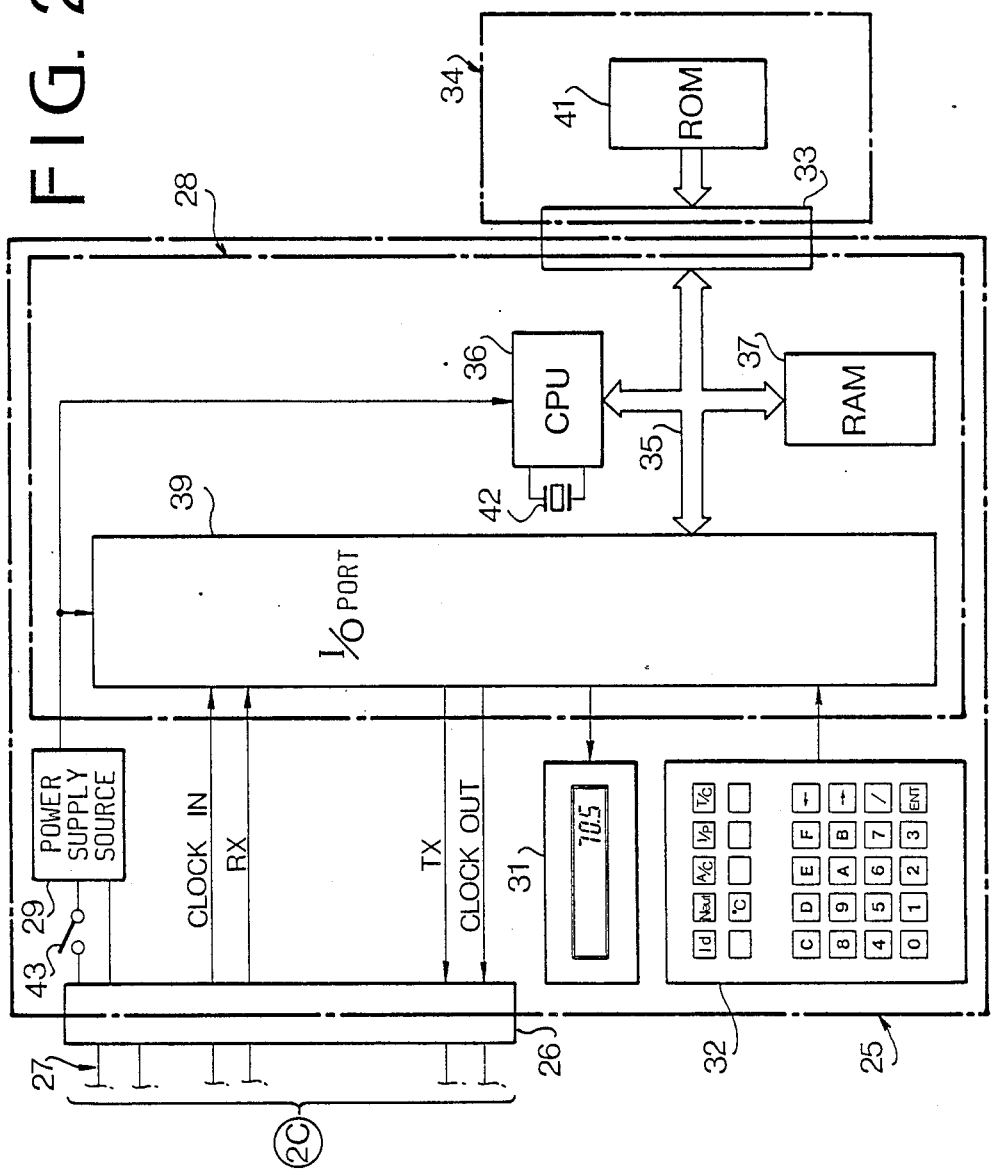

Referring to FIGS. 2a and 2b, the electronic control system 2 comprises a central processor unit (CPU) 3, a random access memory (RAM) 4, a read only memory (ROM) 5, an input interface 6 and an output interface 7. The CPU 3, RAM 4, ROM 5, input and output interfaces 6 and 7 are connected to each other through a bus line 8. Programs and data for controlling the engine are stored in the ROM 5. Power is supplied to the CPU 3, input and output interfaces 6 and 7, and driver 18 from a source V through a constant voltage circuit 45.

The input interface 6 is applied with a coolant temperature signal Tw from a coolant temperature sensor 9, an air-fuel ratio feedback signal $\lambda$ from an O$_2$ sensor 10, an intake-air quantity signal Q from an intake-air quantity sensor 11, an air conditioner operating signal SWa from an air conditioner switch 12, a vehicle speed signal S from a vehicle speed sensor 13, an idling signal SWi from an idle switch 14, a throttle valve opening degree signal $\theta$ from a throttle position sensor 15, a neutral positioning signal SWn from a neutral switch 16 in a transmission, and an engine speed signal N from an engine speed sensor 17. These signals are stored in the RAM 4 after data processing in accordance with the program stored in the ROM 5. The CPU 3 produces respective control signals, which are applied to the driver 18 through the output interface 7. The driver 18 produces signals for controlling a canister controller 19 of a fuel-vapor emission control system, an EGR (exhaust gas recirculation system), an actuator 20, an idling control actuator 21, ignition coils 22, and fuel injectors 23.

The diagnosis device 25 has a control unit 28 and a power supply source 29. The control unit 28 comprises a CPU 36, a RAM 37, and input/output (I/0) port 39.

These elements are connected to each other through a bus line 35. A clock pulse generator 42 is provided for generating synchronizing pulses. A ROM 41 provided in the memory cartridge 34 is detachably connected to the bus line 35 through the connector 33. The ROM 41 stores a plurality of programs for diagnosing various trouble of the control system 2. Inputs of the I/0 port 39 are connected to the output interface 7 of the control system 2 through connectors 24 and 26 and harness 27 so as to receive output signals of sensors and switches 9 to 17. Inputs of the I/0 port 39 are connected to the keyboard 32 for applying with a mode select signal dependent on the operation of the keyboard, and to the output interface 7. Outputs of the port 39 are connected to the input interface 6, the indicator section 30 and the display 31. The power source 29 for supplying the power to the CPU 36 and I/0 port 39 is connected to the source V through the power switch 43.

Figure 3:
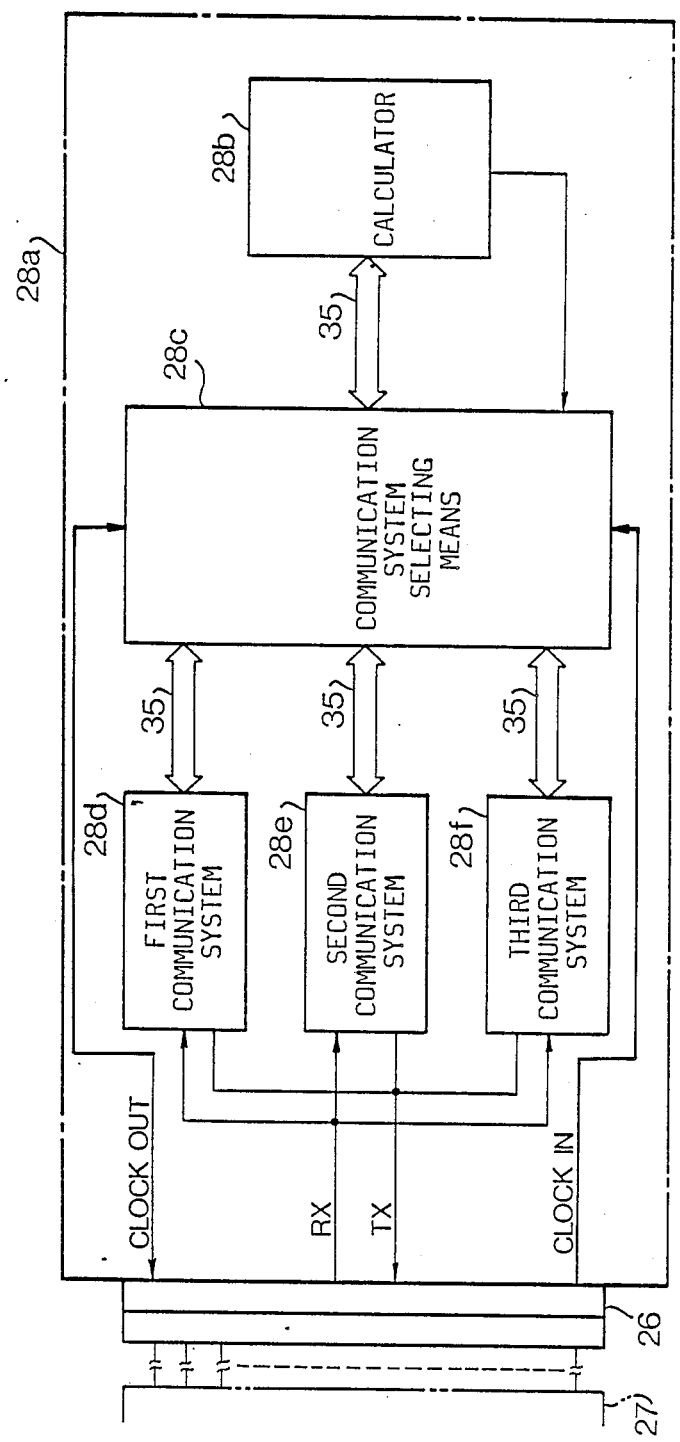
FIG. 3 is a conceptional block diagram illustrating the function of a main part of the system.

Referring to FIG. 3 illustrating the function for selecting one of the communication systems, a communication control section 28a is provided in the control unit 28 including the ROM 41. The communication control section 28a has a calculator 28b, and a communication system selecting means 28c. The ROM 41 stores programs for providing and selecting one of the communication systems comprising first, second and third communication systems 28d, 28e and 28f. Lines 35 are to show signal flow paths for enabling the selection.

The calculator 28b makes calculations dependent on the signals from the control system 2 and produces signals so as to indicate the calculated data on the display 31.

The first, second and third communication systems 28d, 28e and 28f have data formats F1, F2 and F3 as shown in FIGS. 4a, 4b and 4c, respectively. The data format F1 comprises data $a_1$ for a high-order address, data $a_2$ for a low-order address, output data $a_3$ and sum check data $a_4$ for checking the summation of transmitted data.

The data format F2 comprises data $b_1$ for a high-order address, data $b_2$ for a low-order address, a plurality of output data $b_4$ to $b_{n-1}$, byte counter $b_3$ for storing a total number of bytes comprising output data $b_4$ to $b_{n-1}$ and sum check data $b_n$.

The data format F3, which is a so-called non procedure protocol system, comprises data $c_1$ for a high-order address, data $c_2$ for a low-order address, a plurality of output data $c_3$ to $c_{n-1}$ and blank data $c_n$.

Before performing the diagnosis program, the control system 2 is connected to the diagnosis device 25 through the harness 27 and cartridge 34 which is attached to the diagnosis device 25.

The operation of the system is described hereinafter with reference to the flowcharts of FIGS. 5a and 5b. The engine is started, and the following diagnosis program is performed under the running of the engine.

Figure 5A:
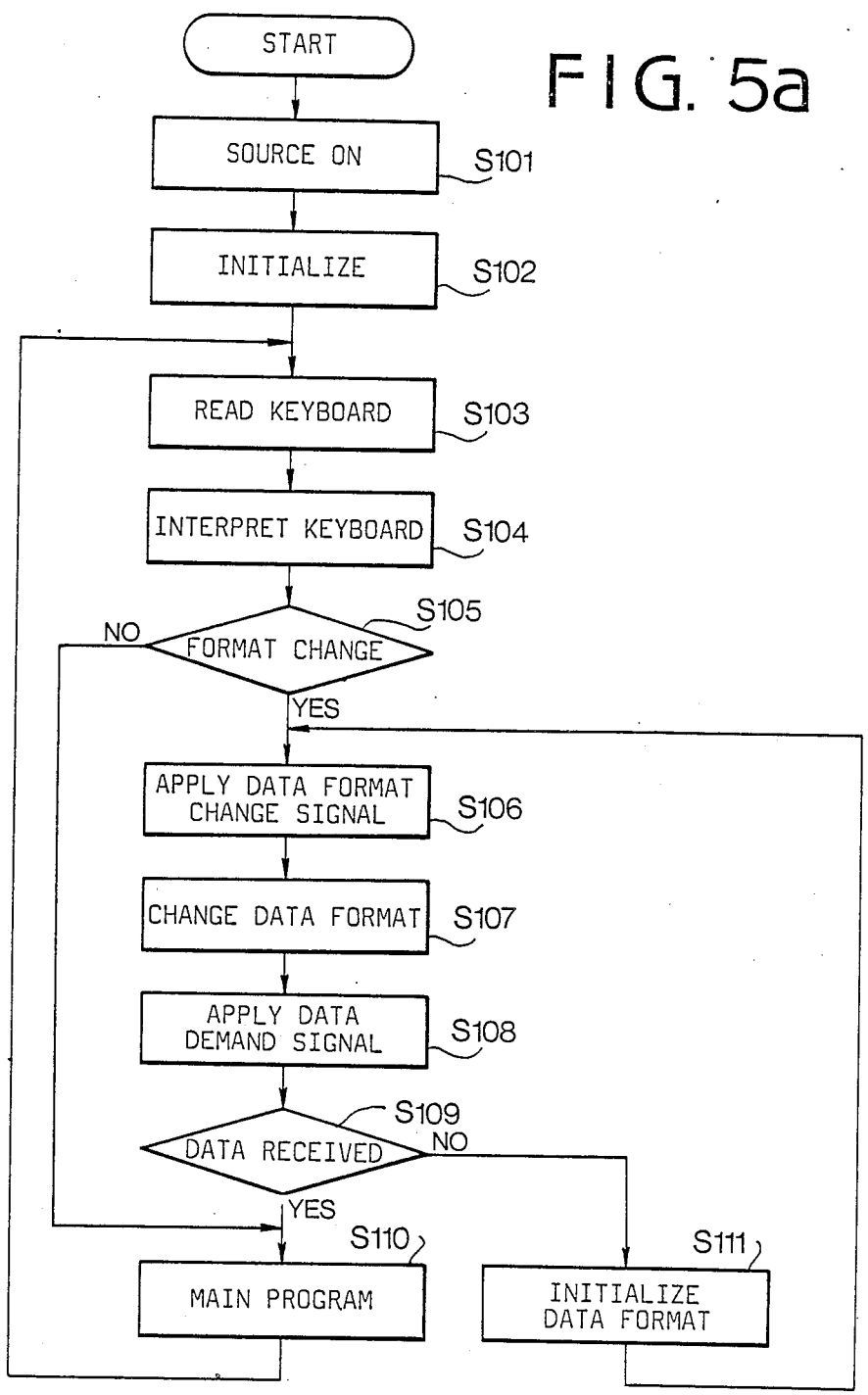
FIG. 5a is a flowchart showing an operation for selecting a format.
Figure 5B:
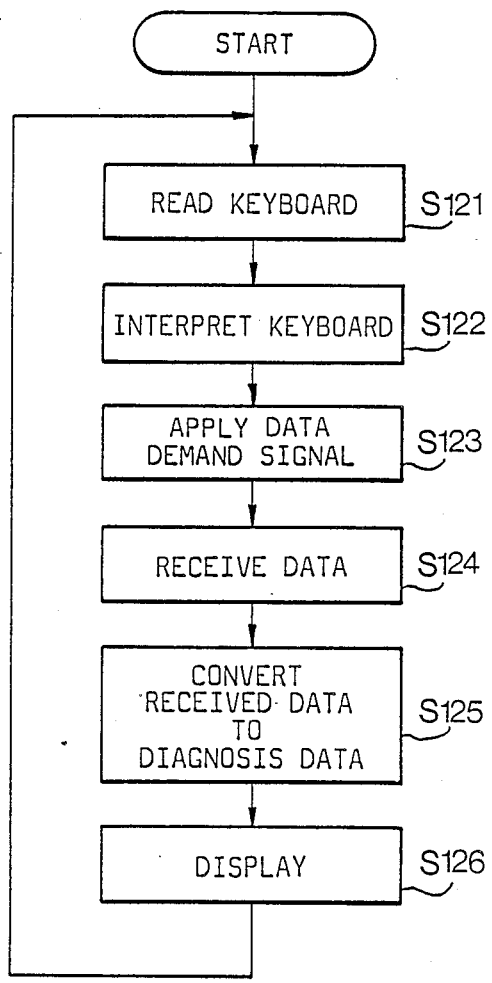
FIG. 5b is a flowchart showing a diagnosis operation of the system.

FIG. 5a shows an operation for detecting the data format of the control system 2. The power switch 43 is turned on at a step S101. At a step S102, initialization of the control unit 28 is performed. At steps S103 and S104, one of the data formats F1 to F3 corresponding to a desired diagnosis mode is input by operating the keyboard 32. For example, the data format F1 mode is input for monitoring the battery voltage and the data format F2 or F3 mode is input for monitoring the fuel injection pulse width. The input mode code is stored in the RAM 37 of the control unit 28 and the contents of the mode code is interpreted by the CPU 36.

At a step S105, it is determined whether a data format which was used at the last program must be substituted with the new stored data format or not. If not, the program proceeds to a step S110 where the diagnosis routine is performed in accordance with the main program. If the change of the data format is decided, a command signal for changing the data format is applied to the control system 2 at a step S106.

At a step S107, a format change signal is applied to the control unit 28. The calculator 28b produces a data format signal which is applied to the system selecting means 28c, so that a program for one of the communication systems 28d, 28e and 28f corresponding to the data format signal is selected (e.g. the second communication system 28e of FIG. 3). At a step S108, a data demand signal TX is applied to the system 2. In accordance with the data demand signal, a corresponding data signal RX is applied to the control unit 28 from the system 2. Step S109 determines whether the data is correctly received by the control unit 28. If the data is correctly received, the program goes to step S110 for performing the main program. If not, the data format is initialized at a step S111 and the program returns to step S106 where another data format is set.

The main program will be described hereinafter with reference to FIG. 5b.

A diagnostician operates the keyboard 32 to select a diagnosis mode, for example for monitoring a battery voltage or an injection pulse width. Thus, a mode code is stored in the RAM 37 in the unit 28.

At a step S121, the stored mode is read by the control unit 28 and at a step S122, the content of the mode is interpreted by the CPU 36. At a step S123, a data demand signal TX corresponding to the mode is applied to the system 2. At a step S124, a data signal RX representing a battery voltage or a fuel injection pulse width is applied to the unit 28 from the control system 2 by the selected data format. At a step S125, the received binary digit is converted into a decimal digit representing the battery voltage or pulse width. At a step S126, the battery voltage or the pulse width is displayed on the display 31. Thus, the diagnostician can diagnose the item about the battery voltage or the fuel injection pulse width.

In case of data such as battery voltage and coolant temperature which do not change much in a short period, data can be transmitted one by one in accordance with the data format F1. In the case of data which change with engine operating conditions, data including different information such as the battery voltage and the pulse width are continuously transmitted in accordance with data format F2 or F3. As a result, the time for transmission and processing of data is remarkably shortened.

The number of data formats may be increased so as to be adapted to various types of control systems of the vehicle.

In accordance with the present invention, since a plurality of types of the data formats is provided for a plurality of data measurements, the diagnosis operation is smoothly performed in a short time.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A diagnosing system for diagnosing an automotive engine which is mounted on a motor vehicle and controlled by an electronic control system, the system having diagnosis means including a diagnosis device and a cartridge detachably connected to said diagnosis device, connecting means for transmitting signals between the electronic control system and the diagnosis device, a keyboard provided in said diagnosis device for inputting keyboard signals, and said diagnosis means being responsive to said keyboard signal for monitoring an operating condition of the engine, the diagnosing system comprising:

a first storing means provided in said cartridge for storing programs to diagnose the engine;

a second storing means in said cartridge for storing programs for providing a plurality of data formats representing a plurality of transmitting patterns for transmitting data between the electronic control system and the diagnosis device and for selecting one of the data formats;

select means responsive to respective of said keyboard signals for selecting a program corresponding to an input format; and demand means responsive to said keyboard signals for transmitting a data demand signal to the electronic control system so as to apply data from the electronic control system to the diagnosis device through the selected data format.

2. The diagnosing system according to claim 1, wherein
said diagnosis device comprises a computer having a central processing unit and a memory, the latter including said second storing means.

3. The system according to claim 1 wherein the diagnosis device has indicators.

4. The diagnosing system as set forth in claim 1, wherein
said diagnosis device includes said select means and a calculator operatively connected to said select means.

5. The diagnosing system as set forth in claim 1, wherein
one of said data formats is a non-procedure protocol system.

* * * * *